United States Patent [19]
Maroney et al.

[11] Patent Number: 4,555,744
[45] Date of Patent: Nov. 26, 1985

[54] STORAGE CABINET

[75] Inventors: Ralf P. Maroney; Gregory A. Fishkind, both of Milford, Conn.

[73] Assignee: Plug-In Storage Systems, Inc., Milford, Conn.

[21] Appl. No.: 645,054

[22] Filed: Aug. 28, 1984

[51] Int. Cl.[4] .............................................. H05K 7/14
[52] U.S. Cl. .................................... 361/212; 361/415; 361/424; 206/334; 211/41; 174/51
[58] Field of Search ............... 361/390, 391, 415, 424, 361/212, 220, 427, 428; 206/328, 334; 211/26, 41; 248/245, 297.2; 174/35 R, 51

[56] References Cited

U.S. PATENT DOCUMENTS

| 3,132,609 | 5/1964 | Chesley | 248/245 |
| 3,258,650 | 6/1966 | Fiege | 361/424 |
| 3,293,353 | 12/1966 | Hendricks | 361/424 |
| 3,541,395 | 11/1970 | Lucchino | 361/391 |
| 4,353,469 | 10/1982 | Etchison, Jr. | 361/415 |
| 4,415,946 | 11/1983 | Pitts | 361/212 |
| 4,427,114 | 1/1984 | Howell | 206/334 |

Primary Examiner—G. P. Tolin
Attorney, Agent, or Firm—Kramer and Brufsky

[57] ABSTRACT

An electrically grounded storage cabinet for electrical circuit board modules is provided with multiple rectangular arrays of brackets for receiving at least one pair of conductive rectangular shelves. The shelves are slidably adjustable in elevation relative to each other on the brackets. A circuit board module is received between registered grooves in the lower surface of one shelf and the upper surface of the other shelf in each pair. The modules are grounded through the shelves, supporting brackets, and cabinet walls to preclude damage to the modules from static electricity discharges and to provide a controlled discharge of any charge remaining in circuit board components after removal from service or any incoming charge from personnel or the environment.

19 Claims, 18 Drawing Figures

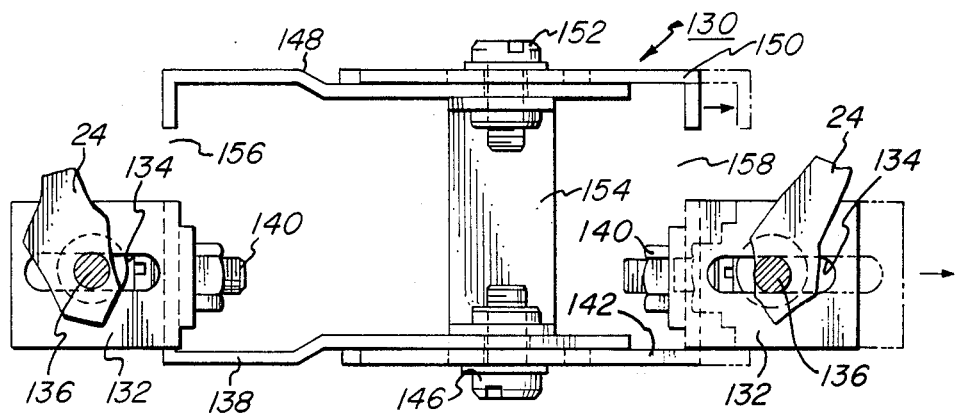
FIG. 3
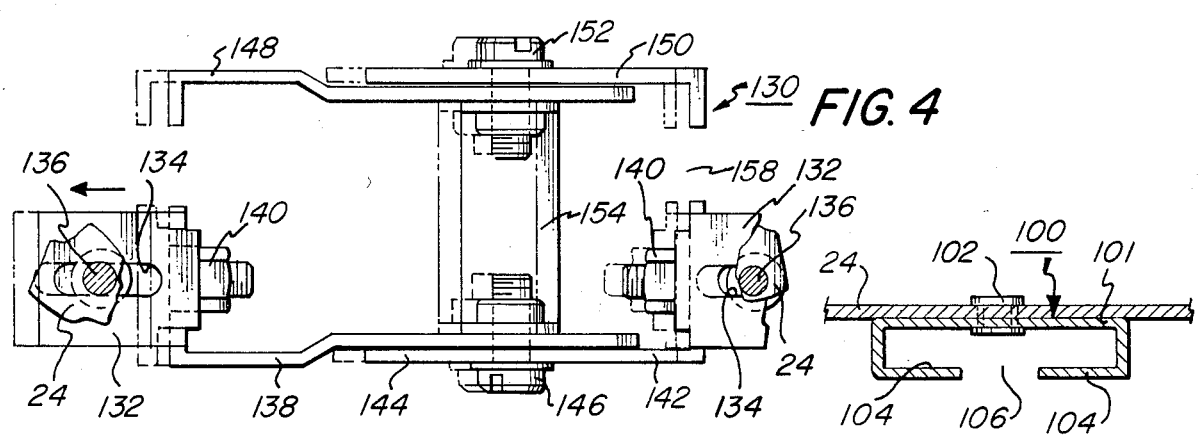
FIG. 4
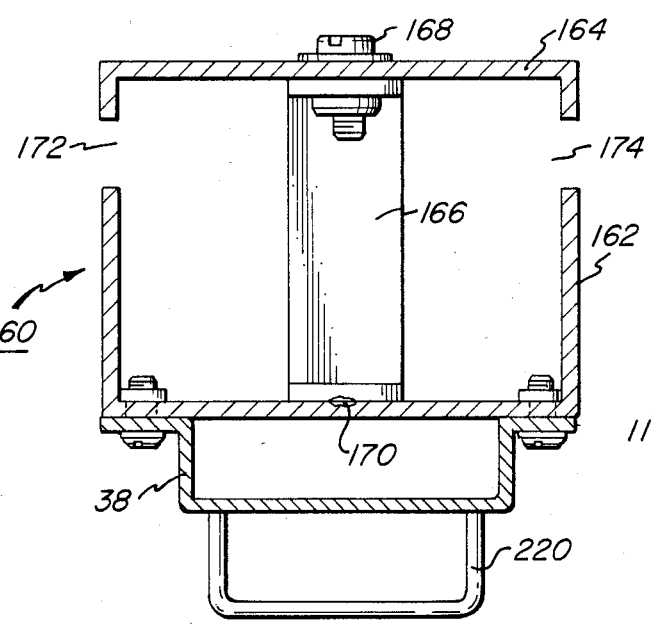
FIG. 5
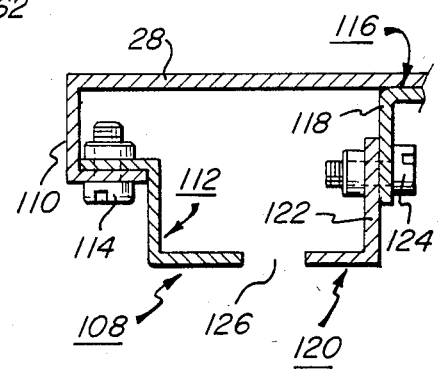
FIG. 7
FIG. 6

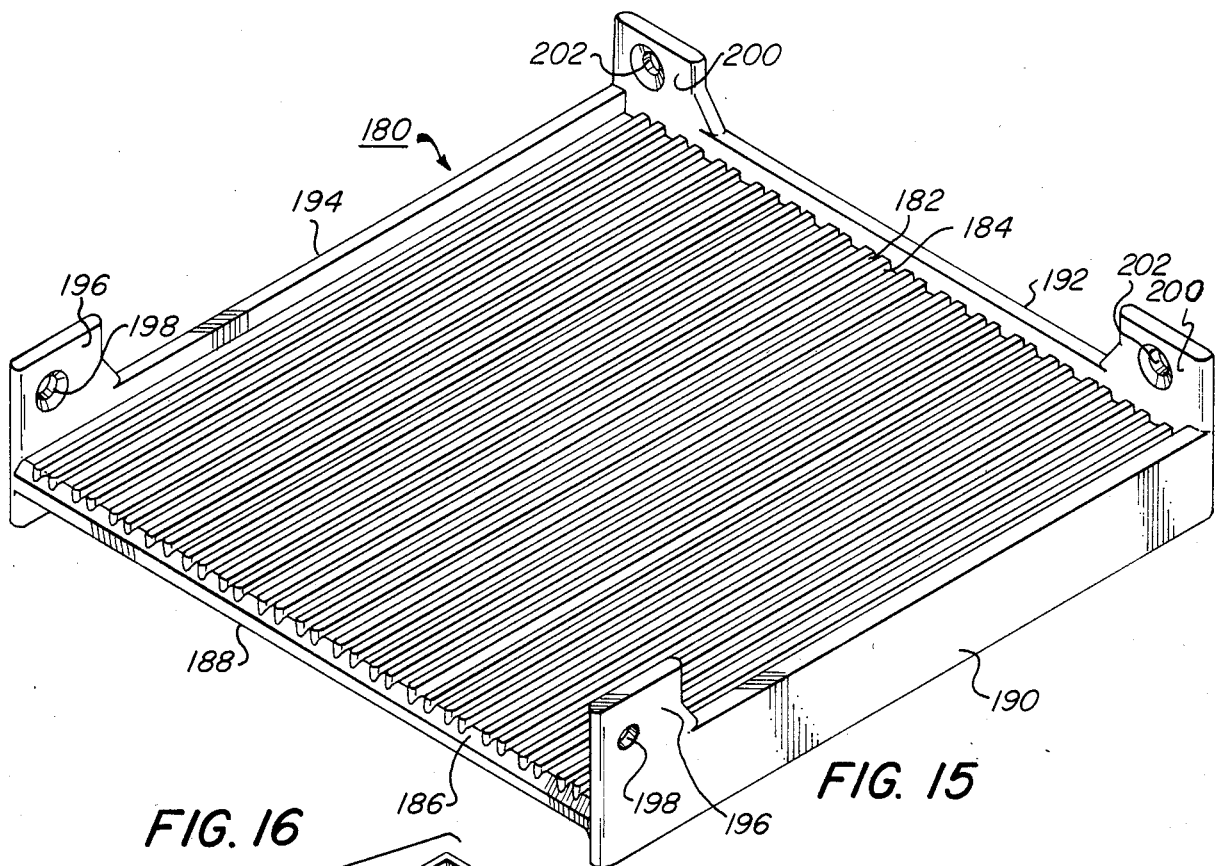
FIG. 15
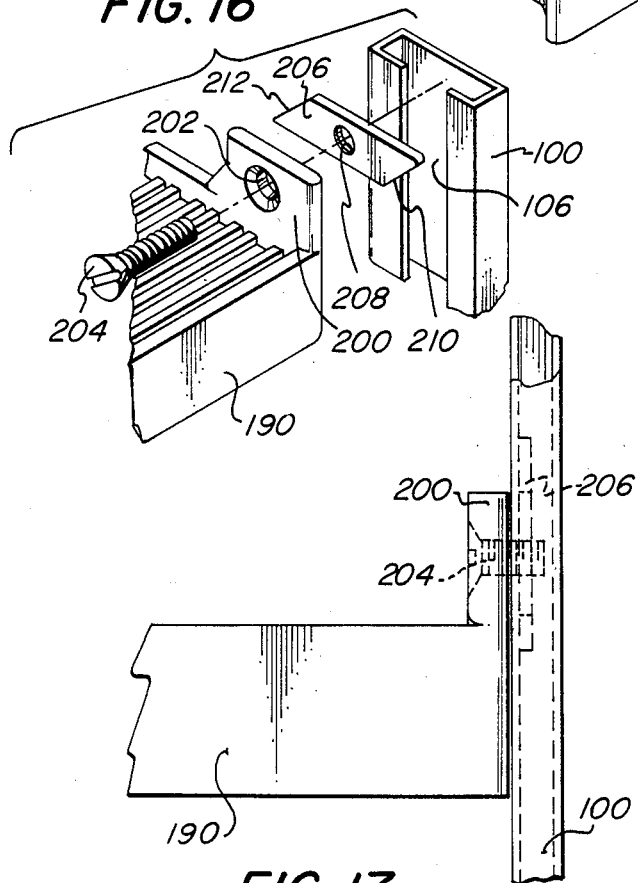
FIG. 16
FIG. 17
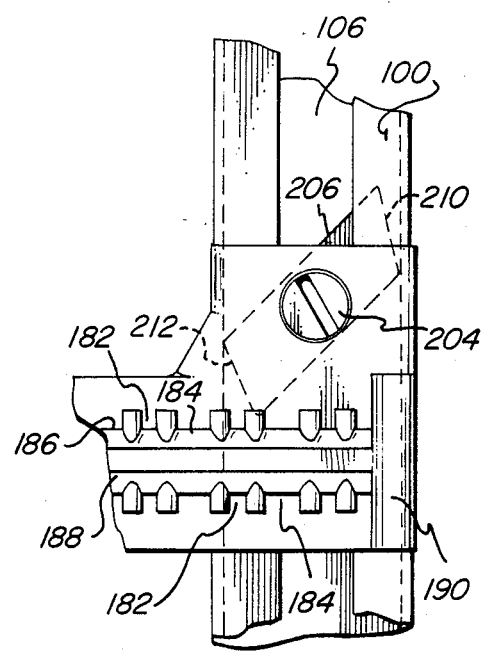
FIG. 18

STORAGE CABINET

BACKGROUND OF THE INVENTION

1. Field of the Invention

This invention relates to a storage cabinet, and more particularly, a storage cabinet for housing circuit boards which are susceptible to damage from static electricity or from rapid discharge of the components thereon after the boards are taken out of service.

2. Description of Prior Art

Heretofore it had been common to handle and store plug-in type circuit board modules in plastic barrier bags or plastic blocks such as "Styrofoam" which has been rendered conductive in order to preclude the modules from being damaged by static electricity in the ambient air or discharged from a person handling the module. Static electricity in the ambient surroundings could set up a sufficient voltage or potential differential between the surroundings and certain electrical components on the module e.g., integrated circuits, to cause substantial damage to the circuit contained on the board. Rapid discharge of components on a circuit board, after the board is removed from service, can also cause substantial damage to the circuitry. Since such circuit boards are used in various high technology applications, such as telephone switching and/or communications circuits, they are expensive, and the inadvertent discharge of any component on the board may lead to considerable repair expenses and/or considerable expenses in replacement of the entire board assembly.

Since the demand for telephone switching circuits may vary from peak periods to peak periods, for example, in summer communities where there is an influx of summer residents, some desirable storage facility must be provided for such plug-in circuit board modules between use. Such a facility must give ready access to the plug-in circuit board module when needed, but must provide a secure facility precluding rapid discharge of components and accidental exposure of the module to potentially damaging static electricity. Barrier bags and foamed polystyrene blocks, while suitable for handling and shipping individual modules, provide a clumsy and space inefficient storage mode for such modules.

Accordingly, this invention relates to a storage facility for plug-in circuit board modules when they are not in use, which is designed to conduct any static electricity away from the module to ground; yet, enables ready storage and access to the module in a storage cabinet wherein the modules can be slid in and out of the cabinet between adjustable height shelves, enabling the modules to be readily classified and identified.

SUMMARY OF THE INVENTION

In accordance with the present invention, the storage cabinet includes a rectangular parallelopiped housing. Access to the interior of the housing is provided through a pair of hinged, bi-fold doors which are slideable in tracks in the top and bottom wall of the housing. Positioned behind each pair of hinged bi-fold doors are a series of brackets providing slots for receiving a clamping lug attached to an upstanding tab or ear on or near each corner of a rectangular shelf formed from a conductive plastic. The top and bottom surface of each shelf includes longitudinal slots. Adjacent slots in each of the top and bottom surfaces are of varying widths.

Lugs attached to each ear on the shelf are dropped within the interior of each bracket and the shelf is slid to a position intermediate the ends of the bracket and the lugs attached to each ear tightened to clamp the shelf in place. A level can be used to assure that the top and bottom surface of each shelf is level or even relative to a horizontal plane. A second shelf is then slid along the brackets and clamped into place relative to the first shelf. Individual plug-in circuit board modules can then be slid between the top surface of the lower shelf and the lower surface of the top shelf in a pair of facing slots. Should the module be provided with a laterally extending circuit element, it can be received within the larger width slot on the top surface of the lower shelf adjacent to the slot in which the module is positioned. By placing the plug-in module in a substantially upright condition between a pair of shelves in the storage cabinet, each module can be cataloged and marked for future use and reference.

The shelves are formed from conductive plastic, such as conductive polyethylene and in the event static electricity should impinge upon any shelf, it will be conducted through the shelf and bracket to the cabinet wall, without damage to a stored module. Similarly, any charge remaining in a component on a circuit board after the board is removed from service will be discharged through the shelf in a controlled manner. The brackets can be formed from aluminum, or any other conductive fabricating material, and the static electricity can be grounded to the surface of the cabinet and through a ground cable on the cabinet to an electrical ground outlet provided in the facility in which the cabinet is placed.

Personal grounding means are also provided for attachment to the exterior of the cabinet while handling the withdrawal or inserting the modules in the cabinet. Such means can comprise a ground strap which may be plugged or clipped to the exterior surface of the cabinet. In this manner, the person handling the module is grounded through the cabinet while removing or inserting one of the modules between the shelves in the cabinet. Means are also provided to level the cabinet and attach it to a supporting surface, if desired, so that it cannot be moved.

Because the cabinet is provided with bi-fold doors and a substantially rectangular parallelopiped housing, the cabinets can be arranged in side-to-side abutment in a minimum amount of space.

BRIEF DESCRIPTION OF THE DRAWINGS

Further objects and advantages of the invention will become more apparent from the following description and claims, and from the accompanying drawings, wherein:

FIG. 3 is a top plan view of one of the bracket components within the interior of the cabinet of FIGS. 1 and 2 as seen along the plane indicated by line 3—3 of FIG. 2 and illustrating in phantom lines the manner in which the position of the bracket can be adjusted;

FIG. 4 is a view similar to FIG. 3 but illustrating an alternative manner of adjusting the position of the bracket within the interior of the cabinet;

FIG. 5 is a cross-sectional view taken substantially along the plane indicated by line 5—5 of FIG. 2 and illustrating the center post construction of the cabinet of FIGS. 1 and 2;

FIG. 6 is a cross-sectional view taken substantially along the plane indicated by line 6—6 of FIG. 2 and illustrating the construction of one of the corner brackets of the cabinet of FIGS. 1 and 2;

FIG. 7 is a cross-sectional view taken substantially along the plane indicated by lines 7—7 of FIG. 2 and illustrating the construction of the brackets mounted on the rear wall of the cabinet of FIGS. 1 and 2;

FIG. 8 is an enlarged detailed view, partly in section, of the upper right hand portion of the cabinet of FIG. 1 designated by the circle 8 in FIG. 1;

FIG. 9 is an enlarged detailed view, partly in section, of the lower right hand portion of the cabinet of FIG. 1 designated by the circle 9 of FIG. 1;

FIG. 15 is a perspective view of one of the shelves used in the cabinet of FIGS. 1 and 2;

FIG. 16 is a fragmentary, exploded perspective view illustrating the manner in which the shelf of FIG. 15 is attached to the brackets within the cabinet of FIGS. 1 and 2;

FIG. 17 is a side view in elevation of the assembled shelf, bracket and clamp of FIG. 16; and FIG. 18 is a front view in elevation of the bracket, clamp and shelf components illustrated in FIG. 17.

DETAILED DESCRIPTION OF THE PREFERRED EMBODIMENT

Figure 1:
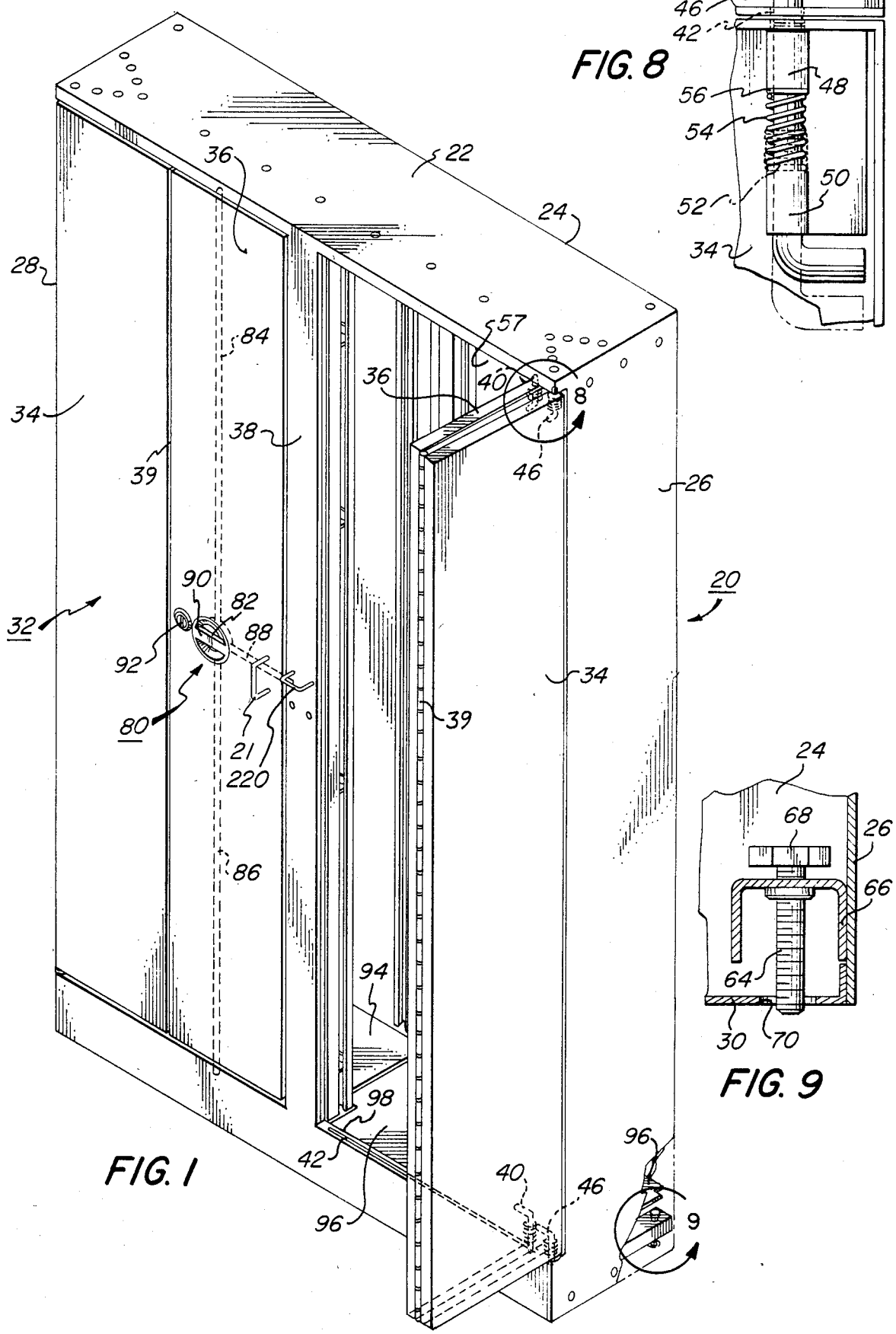
FIG. 1 is a perspective view of the storage cabinet of the present invention.
Figure 2:
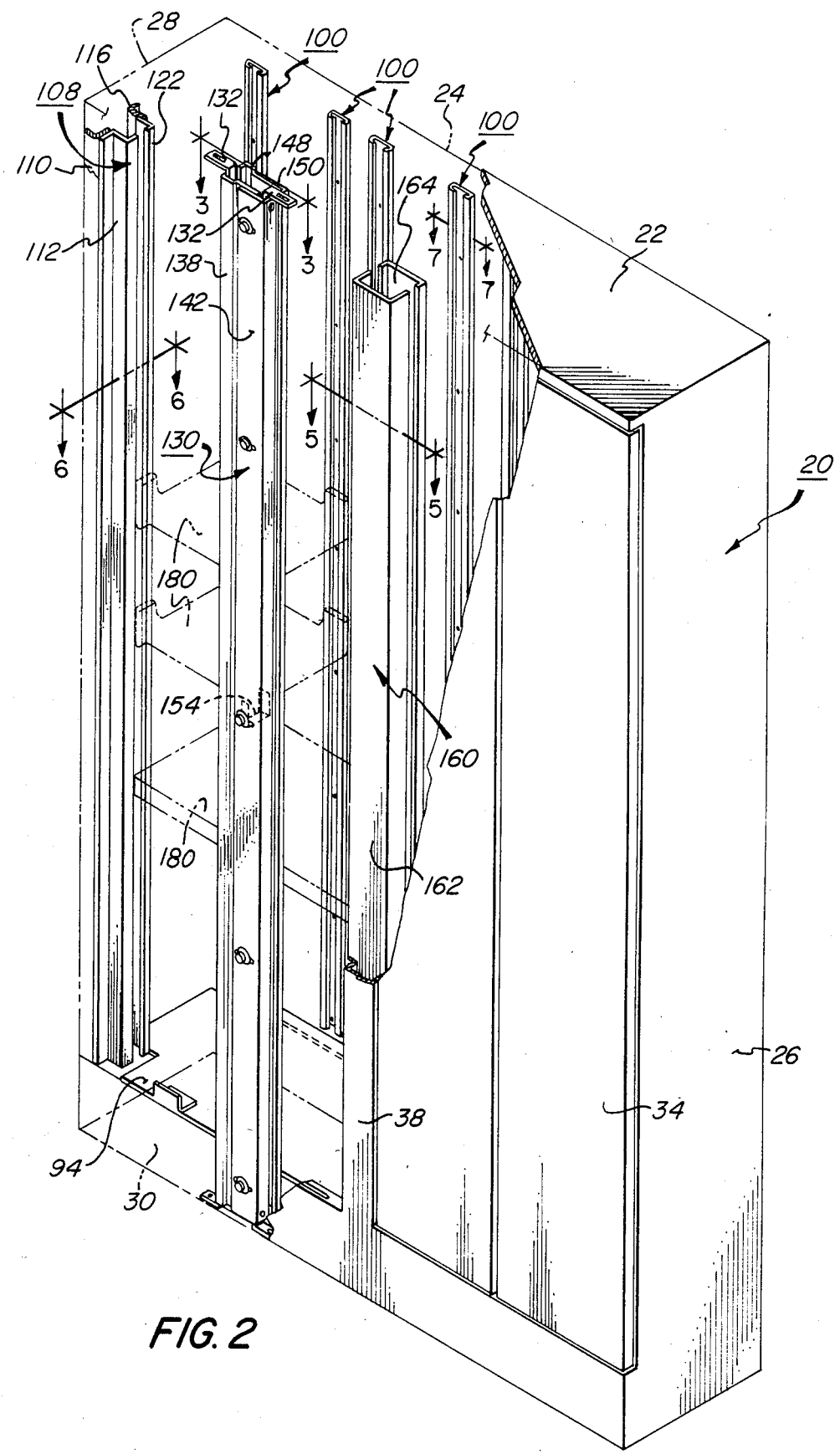
FIG. 2 is a view similar to FIG. 1 with portions of the storage cabinet broken away and portions illustrated in phantom to show the interior bracket components in the cabinet and the manner in which they are used to support a plurality of shelves.
Figure 10:
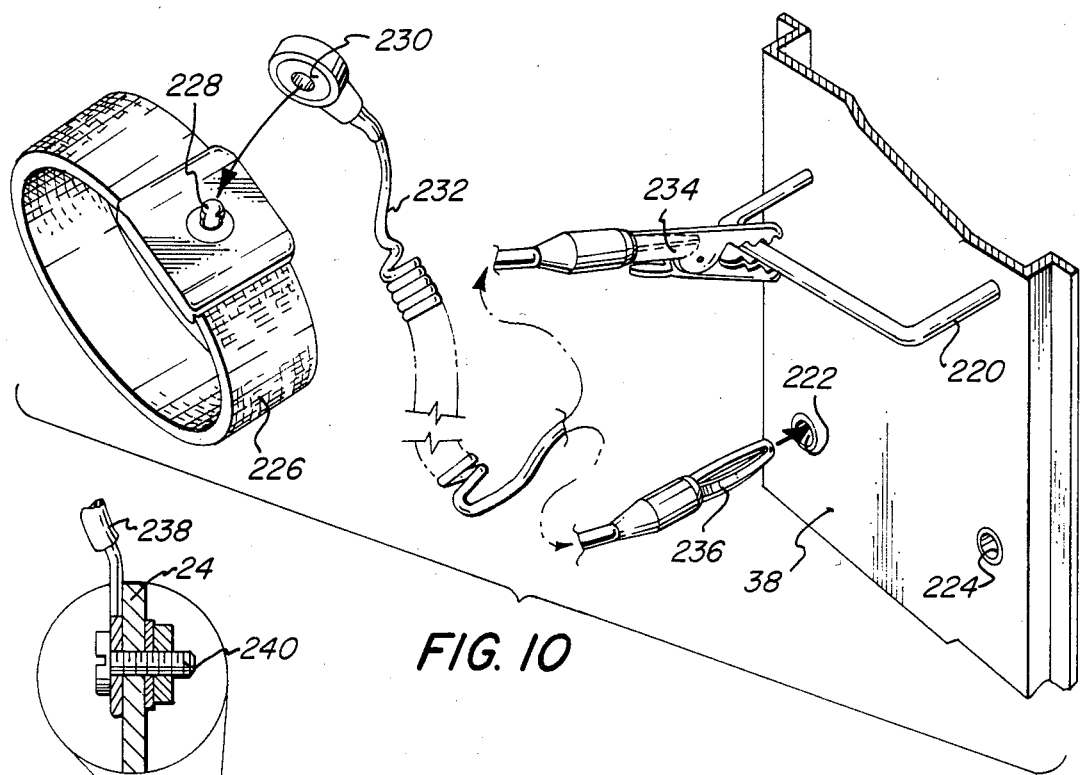
FIG. 10 is an enlarged perspective view, partly in section, of the central portion of the center post of the cabinet of FIGS. 1 and 2 and illustrating the manner in which a person who uses the cabinet to store a plug-in module can be grounded to eliminate personal static charge prior to positioning the module within, or removing it from, the cabinet.

Referring now to the drawings in detail, wherein like numerals indicate like elements throughout the several views, the storage cabinet of the present invention is illustrated in FIGS. 1 and 2 by the numeral 20.

The cabinet 20 is substantially rectangular parallelopiped in shape and includes a top wall 22, a rear wall 24, a pair of side walls 26, 28, a bottom wall 30, and a front wall generally designated by the numeral 32. The side walls 26 and 28 are substantially parallel as are the top and bottom walls 22, 30, respectively, and the front and rear walls 32, 24, respectively. The cabinet is formed from a conductive material.

The front wall 32 consists of a pair of hinged doors 34, 36 on opposite sides of a center post 38. The doors 34, 36 are hinged along abutting edges by a hinge 39 and are standard bi-fold doors in which the door 36 closest to the center post 38 is provided with a pin 40 disposed within a track or slot 42 on the lower surface of top wall 22 and the upper surface of an inwardly extending stepped projection 98 forming a lip on the front wall 32 of the cabinet 20. The door 34 is pivotable at its upper and lower corners about a pin 46, shown in more detail in FIG. 8. Pin 46 is received in spaced, cylindrical tube portions 48 and 50 provided on a fixed plate 52 on the interior of the door 34 and a coil spring 54 disposed between the cylindrical tubes 48 and 50 urges a disk 56 on pin 46 upwardly so that the end of the pin 46 is seated and held stationary within a hole in top wall 22. Door 34 can swivel about upper and lower pins 46 and the hinge 39, and can be removed entirely from the opening 57 providing access into the interior of cabinet 20 by pulling the pins 40 and 46 at their handle portions to remove them from an adjacent track 42 on the lip 98 and top wall 22. The door 34 and the door 36 along with its pins 40 can be removed from the opening 57 providing access to the interior of cabinet 20. In normal use, however, pulling outwardly on a handle 90 on door 36 will cause the doors 34, 36 to pivot about hinge 39 and pins 46. The doors will slide in slots 42 pivoting the doors outwardly about pins 46 to provide access to the interior of cabinet 20. Pulling the doors by a handle 21 on each door 36 will reverse this movement to close cabinet 20.

The bottom wall 30 of the cabinet 20 is provided with a plurality of slots such as 58, 60 and 62. The slots can be used to fasten the cabinet in place with concrete anchors or other similar fasteners. Prior to fixing the bottom wall 30 to a support surface, the cabinet can be leveled by rotation of a foot in the form of an elongated screw 64 threadedly mounted on an inverted U-shaped bracket 66 secured to the lower portion of the side wall 26 and side wall 28 of cabinet 20. Rotation of the head 68 of screw 64 will raise or lower the screw stem for protrusion through an opening 70 in the bottom wall so that the bottom of the screw can contact the supporting surface to raise or lower the cabinet to level the same.

The cabinet 20 is provided with a locking mechanism on door 36 generally indicated by the numeral 80 which consists of a standard rotatable locking device 82 in which three bars 84, 86 and 88 are extended or retracted upon rotation of handle 90 to seat within upper and lower slots 42 and an opening in the side of center post 38. Once the bars 84, 86 and 88 are inserted within the respective openings, rotation of the handle 90 can be controlled and locked by the insertion of a key within the keyhole 92 provided on the front wall of the cabinet adjacent to rotatable handle 90. A similar arrangement can be provided on each door 36 on the opposite sides of the center post 38.

Figure 12:
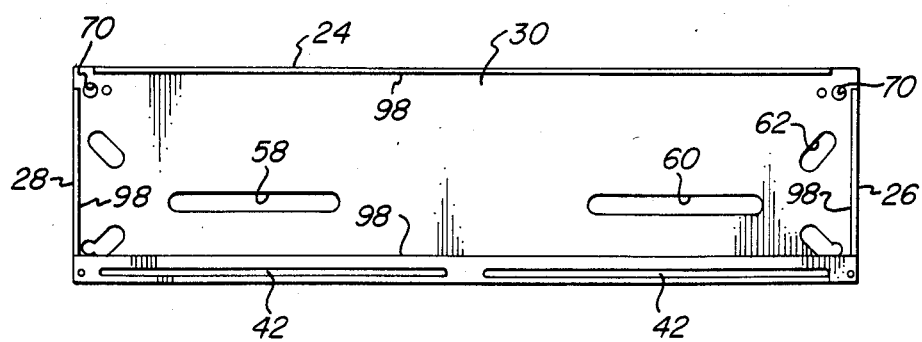
FIG. 12 is a plan view of the bottom interior of the cabinet.

A pair of plates 94 and 96 can be positioned over portions of the inwardly extending lip 98 attached to the front wall and corresponding lips 98 also provided on rear and side walls (see FIG. 12) to substantially close the bottom wall 30 from view.

The interior space within cabinet 20 contains a number of different bracket arrangements.

Spaced along the rear wall 24 in paired locations are a series of the elongated brackets generally designated by the numeral 100 connected to the rear wall by rivets 102. The brackets 100 are C-shaped in cross-section including a bight portion 101 and a pair of flanges 104 extending generally parallel to the bight portion 101 but spaced from each other to provide an access opening 106 to the interior of each bracket.

Connected to the interior corner at the juncture of each of the side walls 28 and 26 with the front wall 32 behind door 34 is a bracket arrangement generally indicated by the numeral 108. Each of the side walls 26 and 28 includes a substantially L-shaped extension 110 to which is secured a Z-shaped member 112 by a threaded fastener 114. An L-shaped bracket 116 is welded or otherwise secured in spaced relation to the L-shaped extension 110 on each of the side walls 26, 28. Secured to the longer leg 118 of L-shaped bracket 116 is a second L-shaped bracket 120. The longer legs 122 and 118 of each of the brackets 116 and 120, respectively, are secured together by a threaded fastener or the like 124. The Z-shaped bracket 112 and L-shaped bracket 122 are spaced to provide an access opening 126 to the interior of the bracket.

A bracket generally designated by the numeral 130 is attached between the top and bottom walls 22, 30, respectively of the cabinet 20 adjacent the front wall 32 opposite and between a pair of the C-shaped brackets 100 mounted on the back wall 24. The bracket 130 includes a L-shaped tab 132 having a centrally located and elongated slot 134 for receiving a threaded fastener 136 therethrough to attach the tab 132 of a bracket 130 to the top and bottom walls of the cabinet 20, respectively. The tab 132 is attached to the shorter leg of an L-shaped bracket 138 by a threaded fastener 140. A similar L-shaped bracket 142 is also provided with a tab 132 adjacent the top and bottom walls of the cabinet 20 for attachment of the bracket thereto and the bracket 142 has its longer leg provided with a slot 144 which receives therethrough a threaded fastener 146 which secures the bracket 142 in abutting and overlying relation to the bracket 138. A similar bracket arrangement 148 and 150 is disposed opposite the brackets 138 and 142 and the brackets are secured together by a threaded fastener 152. Threaded fasteners 146 and 152 are also received through the upright legs of one or more U-shaped tie bars 154 extending perpendicular to and between the parallel bracket arrangements. The bracket 138 and 148 are spaced from each other to provide an access opening 156 to the space between the brackets while the L-shaped brackets 142 and 150 are spaced to provide an access opening 158 between the brackets.

The bracket opening 156 is aligned with and parallel to the bracket opening 126 provided in the bracket 108. The distance between the bracket 108 and 130 can be adjusted as illustrated in FIG. 3 by loosening one or more of the fasteners 136 to move the bracket elements 138 and 148 and/or bracket elements 142 and 150 closer or away from the bracket 108 by adjusting the distance of a tab 132 from the bracket 108 by sliding the slot 134 relative to the fastener 136 which moves the entire tied bracket assembly 130 towards and away from the bracket 108. Alternatively, as shown in FIG. 4, the opening 158 can be adjusted so that its distance is varied from the center post 38 by moving the brackets 142 and 150 relative to the fasteners 146 and 152 upon loosening of the same down the length of the brackets. The fasteners 146 and 152 will slide in the slot 144 in each leg 142, 150.

A bracket generally identified by the number 160 is secured to the rear of the center post 38 and includes a pair of facing U-shaped brackets 162 and 164 held together by perpendicular, U-shaped tie members 166, spaced along the length of the bracket 160. One leg of each tie member 166 is secured to the bracket 164 by a threaded fastener such as 168 while the other leg is welded as shown at 170 to the bight portion of the bracket 162. Brackets 162 and 164 are spaced from each other to provide access openings 172 and 174. The opening 172 faces the opening 158 in the bracket 138 and extends parallel thereto for the height of the cabinet.

The opening 174 faces an opening 156 in another bracket 130 provided on the other side of the center post 38 behind the hinge 39 of the bi-fold doors 34, 36 and the opening 158 in that bracket faces the opening 126 in the second corner bracket 108 on the right hand side of the cabinet as viewed in FIGS. 1 and 2. Furthermore, additional C-shaped brackets 100 are provided on the rear wall 24 of the cabinet 20. The center post bracket 160 is aligned between two C-shaped brackets 100 and the pattern shown in FIG. 2 is repeated behind the additional brackets 130 and 108 on the right hand side of the cabinet 20 in FIG. 2.

Figure 13:
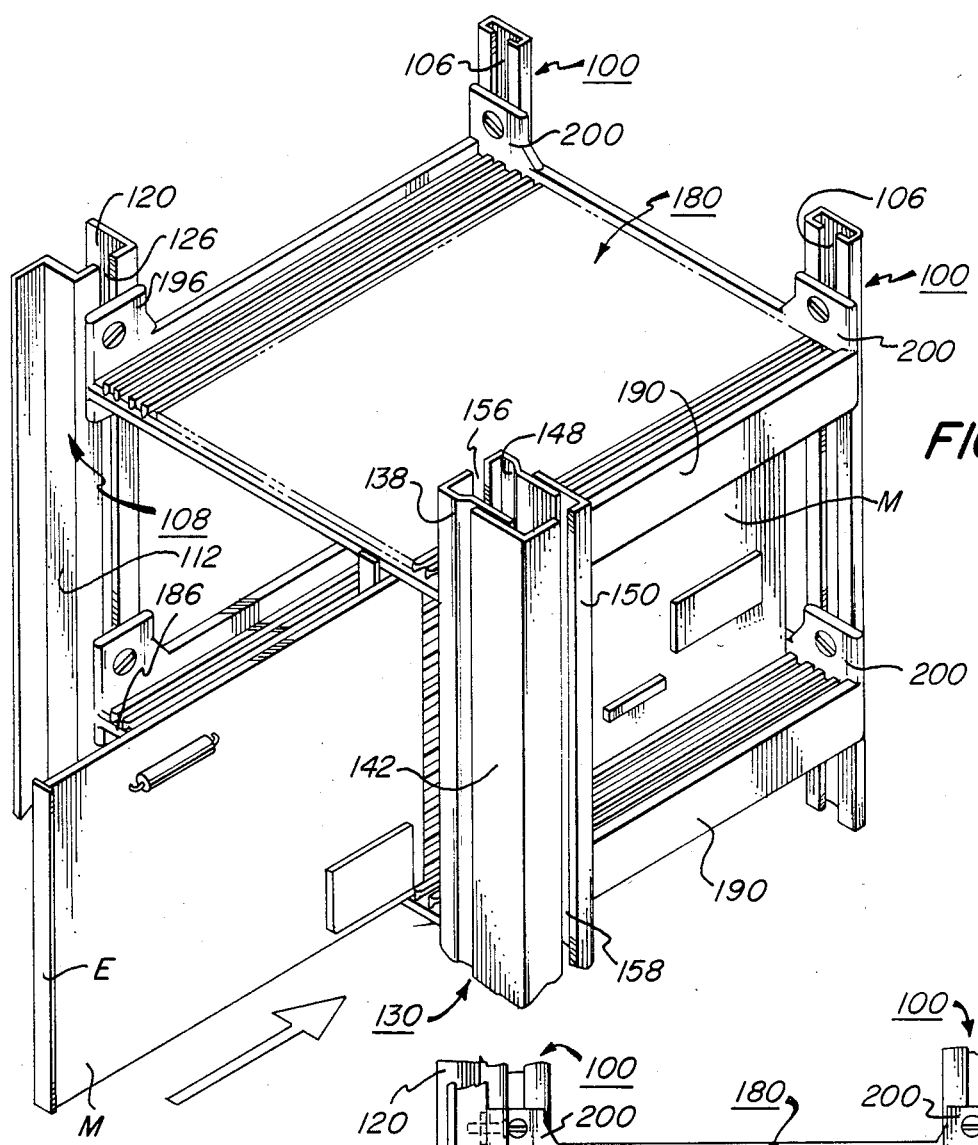
FIG. 13 is a partial perspective view of a segment of the interior of the cabinet of FIGS. 1 and 2 and illustrating the manner in which a plug-in module is stored and removed from the cabinet between a pair of adjustable shelves clamped between a rectangular array of the brackets in the interior of the cabinet.

A shelf 180, shown more clearly in FIGS. 13 and 15, formed from conductive plastic, such as a conductive polyethylene is adapted to be suspended between a rectangular array of four of the adjacent brackets in the interior of cabinet 20.

The shelf 180 is the subject of a patent application assigned to the same assignee as the instant invention in U.S. Ser. No. 645,053, entitled "Antistatic Shelf For Electronic Circuit Boards" and such disclosure is incorporated by reference into this application. The shelf comprises a series of grooves 182 and 184 on both its upper and lower surfaces 186 and 188. The grooves 184 are of a greater width than the grooves 182 and as shown in FIG. 15 the grooves on the lower surface 188 of a shelf 180 are adapted to receive a plug-in circuit board module M between it and the grooves on the upper surface 186 of a similar shelf 180 suspended between a rectangular array of a combination of the brackets 108, 100, 130 and 160, or their reverse, such as brackets 108, 100, 100, 130 and 130, 100, 100, 160.

Each of the shelves 180 includes three side walls 190, 192 and 194 about its rectangular periphery, with the front of the shelf left open for receipt of the module M. Connected to each of the side walls 190 and 194 is an upright ear or tab 196. The ear or tab 196 has an opening 198 formed therethrough. Extending upwardly at opposite ends of the side wall 192 is an upright ear or tab 200 which is oriented to extend in a direction perpendicular to the direction of orientation of the tabs 196. Each of the ears or tabs 200 includes an opening 202 therethrough.

As shown more clearly in FIGS. 13, 16, 17 and 18, a threaded fastener 204 is adapted to be inserted through a selected one of the openings 198 and 200 and connected to an aluminum or conductive steel clamp 206 provided with a threaded opening 208 and a pair of sloped side edges 210 and 212.

A pair of shelves 180 are disposed between a rectangular array of the brackets by simply attaching the clamp 206 to a fastener 204 at each corner of the shelf and inserting the clamp 206 in the space within the interior of one of the brackets in a rectangular array through one of the access openings 126, 106, 156, 158, 172 or 174, as the case may be. The shelf 180 may then be adjusted in elevation with respect to the top or bottom wall of the cabinet 20 by sliding the clamps 206 on each corner within the interior of each bracket in the array until the desired elevation is reached. A level is then placed on the shelf 180 to determine that it is parallel to the horizontal or level at the particular selected elevation.

Then the fasteners 204 are tightened, which will cause the clamps 206 to rotate until the clamp surfaces 210 and 212 abut with the interior wall surfaces of each individual bracket until they can no longer turn, wherein upon further tightening of the screws 204 the shelf 180 will be retained in its adjusted elevation. When the proper adjusted elevation of a pair of shelves is attained, the module M can then be inserted between a pair of facing grooves 182 and if the module contains a circuit component which extends outwardly from the side surface thereof, provision is made to receive it in the wider groove 184 in the shelf 180.

Figure 14:
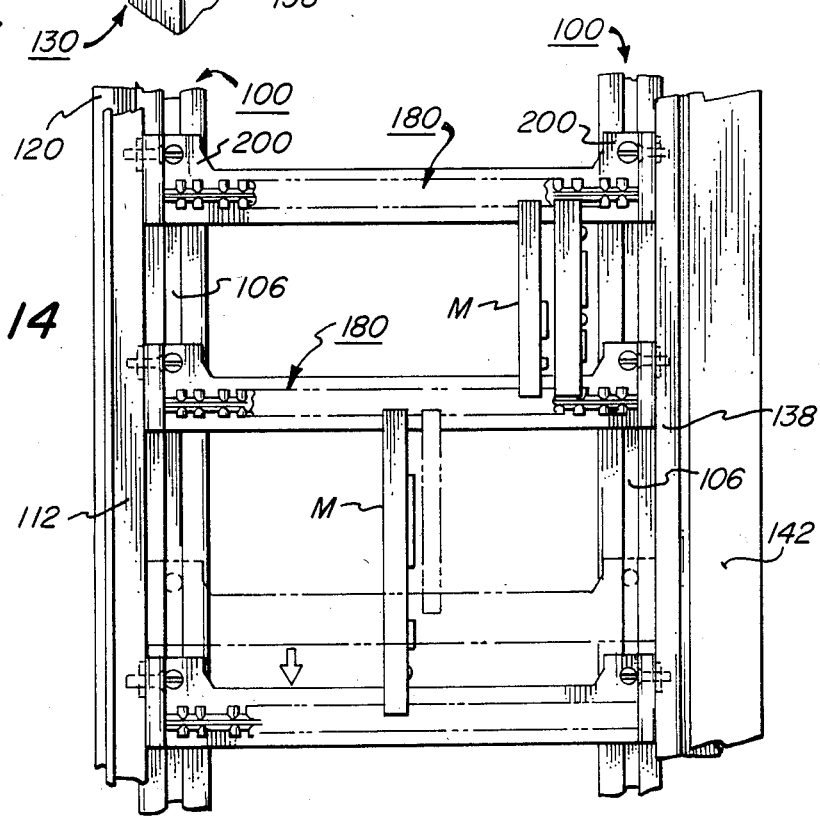
FIG. 14 is a front view in elevation of the cabinet interior portion illustrated in FIG. 13.

By virtue of being able to slide the modules M in and out of the cabinet 20 between the adjusted shelves 180, suitable identification can be placed on the module for ready inspection on an end E, for example, and various size modules can be stored by simply varying the spacing between adjacent shelves. While FIGS. 13 and 14 illustrate the positioning of a shelf 180 between a rectangular array of brackets 100, 100, 108, and 130 it should be understood that similar shelves 180 can be attached between brackets 130, 100, 100, and the center bracket 160.

The center post 38 is also provided with a metal U-shaped extension 220 and a pair of jack-plug receiving openings 222 and 224. An elastic wrist strap 226 can be provided for securement to the wrist of a module handler when removing and/or placing one of the modules M within the cabinet 20. The wrist strap 226 includes an electrical contact 228 adapted to be secured to an electrical contact 230 connected to a conductive wire 232 which terminates in two leads, one of which is connected to an alligator clip 234 and the other to a banana jack 236. The alligator clip 234 can be connected to the U-shaped wire 220 or alternatively, the banana jack 236 can be inserted in one of the openings 222 and 224 to connect the person handling the equipment to the center post 38 so that in the event the person contains static electricity any charge will be dissipated from the wrist strap through the center post 38 and exterior of the cabinet to an electrical grounding outlet normally found in the facility.

Figure 11:
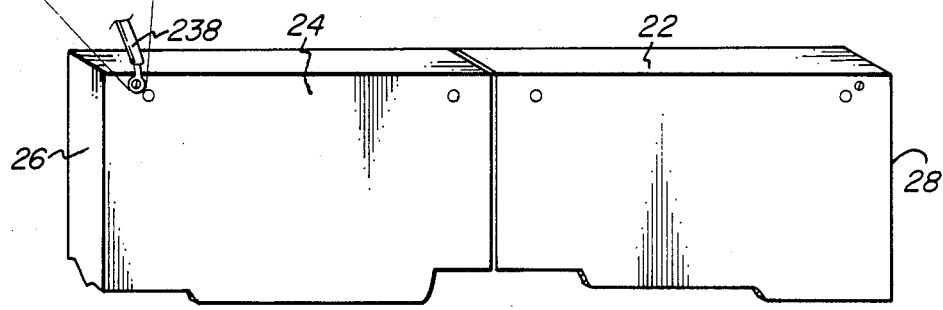
FIG. 11 is a partial rear perspective view of the cabinet of FIGS. 1 and 2.

The top wall 22 of the cabinet 20, as shown in FIG. 11, can be connected through a wire 238 by a threaded fastener 240 which is inserted within a grounded outlet of a receptacle in the storage facility to conduct any static discharge to ground. Similarly, any static discharge from the surrounding ambient air will be conducted by the cabinet 20 and/or the interior conductive shelves 180 to ground through the wire 238 precluding damage to any of the modules M stored within the cabinet.

What is claimed is:

1. A storage cabinet for circuit board modules comprising:
   a housing;
   a plurality of electrically conductive brackets extending longitudinally in spaced relation in said housing, each of said brackets including
   a surface connected to said housing, a longitudinal slot and a hollow interior behind said slot,
   at least one pair of shelves of conductive material slidably mounted for adjustable movement relative to said brackets and each other in each of said slots, each of said shelves including
   a series of grooves extending substantially perpendicular to said brackets on the top and bottom surface of each of said shelves,
   the grooves on each adjacent pair of shelves slidably disposed on said brackets being in registration with each other for receiving a circuit board module therebetween, and
   means attached to said cabinet for electrically grounding the cabinet.

2. The storage cabinet of claim 1 wherein each of said shelves are formed from conductive plastic material.

3. The storage cabinet of claim 1 comprising at least four of said brackets arranged in a rectangular array wherein the longitudinal slot in at least one of said brackets is adjustable towards and away from the longitudinal slot in an adjacent bracket in said rectangular array.

4. The storage cabinet of claim 1 including a plurality of rectangular arrays of said brackets in said housing.

5. The storage cabinet of claim 1 wherein said housing is closed by at least one pair of hinged, bi-fold doors.

6. The storage cabinet of claim 1 including means attached to said cabinet for leveling the housing relative to a horizontal surface.

7. The storage cabinet of claim 1 comprising at least four of said brackets arranged in a rectangular array wherein the longitudinal slots in at least one pair of adjacent brackets in said rectangular array of brackets are oriented perpendicular to each other.

8. The storage cabinet of claim 1 wherein
   each of said shelves is substantially rectangular and includes
   an upright tab at each corner thereof, and
   clamp means received by each tab for securing each tab within the interior of one of said brackets.

9. The storage cabinet of claim 8 wherein said clamp means includes
   an electrically conductive rotatable plate having sloping side edges adapted to contact a surface of a bracket behind said slot in said bracket.

10. The storage cabinet of claim 7 wherein
    an adjacent pair of said brackets in said rectangular array are substantially C-shaped in cross-section, and
    the remaining pair of said brackets in said rectangular array each include
    at least one pair of L-shaped members in cross-section whose longer legs are overlapped and secured together,
    one of the pair of overlapped L-shaped members in said one pair of remaining brackets being slidably adjustable relative to each other.

11. The storage cabinet of claim 7 wherein
    an adjacent pair of said brackets in said rectangular array are substantially C-shaped in cross-section, and
    the remaining pair of said brackets in said rectangular array include
    two pairs of L-shaped members in cross-section whose longer legs are slidably adjustably overlapped and secured together in spaced relation, and
    a pair of substantially U-shaped members in cross-section having their bight portion secured together in spaced relation.

12. The storage cabinet of claim 10 wherein
    each of said shelves is substantially rectangular and includes
    an upright tab at each corner thereof, and
    clamp means received by each tab for securing each tab within the interior of one of said brackets.

13. The storage cabinet of claim 12 wherein said clamp means includes
an electrically conductive rotatable plate having sloping side edges adapted to contact a surface of a bracket behind said slot in said bracket.

14. The storage cabinet of claim 11 wherein
each of said shelves is substantially rectangular and includes
an upright tab at each corner thereof, and
clamp means received by each tab for securing each tab within the interior of one of said brackets.

15. The storage cabinet of claim 14 wherein said clamp means includes
an electrically conductive rotatable plate having sloping side edges adapted to contact a surface of a bracket behind said slot in said bracket.

16. The storage cabinet of claim 1 including
means adapted to be removably attached to said cabinet for electrically grounding a person removing or inserting a circuit board module from between a pair of said shelves.

17. The storage cabinet of claim 16 wherein said removably attachable means includes
an electrical connection on said housing, and
a conductive wrist band for securement to the person adapted to be electrically attached to the electrical connection on said housing.

18. The storage cabinet of claim 17 wherein said wrist band is electrically attached to the electrical connection on said housing by an alligator clip.

19. The storage cabinet of claim 18 wherein said wrist band is electrically attached to the electrical connection on said housing by a plug.

* * * * *